(12) United States Patent
Graff et al.

(10) Patent No.: US 11,828,440 B2
(45) Date of Patent: Nov. 28, 2023

(54) IEC ZONE 1 RATED LED LIGHT ENGINE USING PRE-MOLDED OPTIC

(71) Applicant: Appleton Grp LLC, Rosemont, IL (US)

(72) Inventors: Timothy E. Graff, Arlington Heights, IL (US); Jean-Francois Monteil, Signy-l'Abbaye (FR); Marius Sav, Floresti (RO); Sumit Kumar, Pune (IN)

(73) Assignee: Appleton Grp LLC, Rosemont, IL (US)

( * ) Notice: Subject to any disclaimer, the term of this patent is extended or adjusted under 35 U.S.C. 154(b) by 0 days.

(21) Appl. No.: 17/686,937

(22) Filed: Mar. 4, 2022

(65) Prior Publication Data

US 2022/0307675 A1    Sep. 29, 2022

(30) Foreign Application Priority Data

Mar. 23, 2021   (FR) ...................................... 2102902

(51) Int. Cl.
*F21V 19/00* (2006.01)
*F21V 5/00* (2018.01)

(52) U.S. Cl.
CPC ............ *F21V 19/002* (2013.01); *F21V 5/007* (2013.01); *F21V 19/003* (2013.01)

(58) Field of Classification Search
CPC ....... F21V 19/002; F21V 5/007; F21V 19/003
See application file for complete search history.

(56) References Cited

U.S. PATENT DOCUMENTS

| | | | |
|---|---|---|---|
| 8,899,786 B1 * | 12/2014 | Moghal | F21K 9/60 362/249.02 |
| 10,854,796 B2 | 12/2020 | Jayawardena et al. | |
| 2004/0246452 A1 * | 12/2004 | Fujisawa | H01J 61/025 353/99 |
| 2008/0298060 A1 | 12/2008 | Ohkawa | |
| 2010/0271708 A1 | 10/2010 | Wilcox | |
| 2011/0103051 A1 | 5/2011 | Wilcox et al. | |

(Continued)

FOREIGN PATENT DOCUMENTS

| | | |
|---|---|---|
| CN | 206268916 U | 6/2017 |
| EP | 2701215 B1 | 1/2018 |

(Continued)

OTHER PUBLICATIONS

PCT International Search Report and Written Opinion, Application No. PCT/IB2022/051912, dated Jun. 17, 2022, 9 pages.

(Continued)

*Primary Examiner* — Tracie Y Green
*Assistant Examiner* — Michael Chiang
(74) *Attorney, Agent, or Firm* — McDonnell Boehnen Hulbert & Berghoff LLP

(57) ABSTRACT

An encapsulated LED engine having a printed circuit board, a plurality of LED arrays, each of said LED arrays mounted on said printed circuit board, and electrically connected to each other, an encapsulation layer comprising a pre-molded optic positioned over and adhered to the printed circuit board, and a frame positioned over the LED arrays and secured to the printed circuit board. A method of forming an encapsulated LED engine is also provided.

14 Claims, 5 Drawing Sheets

(56) References Cited

U.S. PATENT DOCUMENTS

Figure 1A:
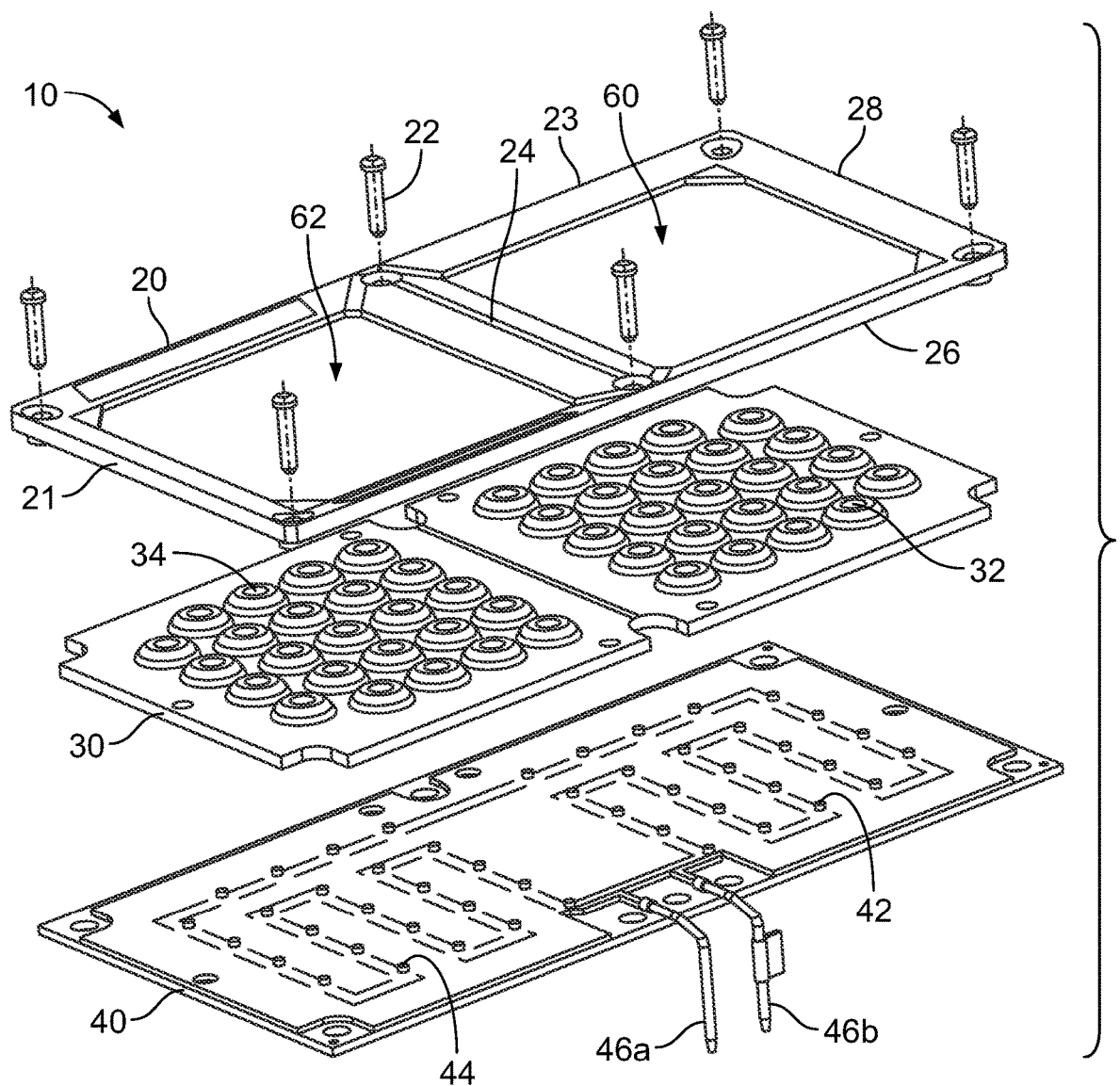

| | | | |
|---|---|---|---|
| 2011/0310600 A1* | 12/2011 | Lehman | F21V 29/76 |
| | | | 216/13 |
| 2012/0087118 A1 | 4/2012 | Bailey et al. | |
| 2012/0300456 A1 | 11/2012 | Phillips, III et al. | |
| 2013/0003345 A1* | 1/2013 | Hamby | F21K 9/20 |
| | | | 362/231 |
| 2013/0021797 A1 | 1/2013 | Kubo | |
| 2014/0192529 A1* | 7/2014 | Wilcox | F21V 29/763 |
| | | | 362/244 |
| 2018/0073706 A1 | 3/2018 | Palfreyman et al. | |
| 2020/0028037 A1 | 1/2020 | Kumar et al. | |
| 2020/0029403 A1 | 1/2020 | Chaturvedi et al. | |
| 2021/0381686 A1* | 12/2021 | Huang | F21V 5/007 |
| 2022/0221133 A1* | 7/2022 | Dachlan | F21V 29/70 |

FOREIGN PATENT DOCUMENTS

| | | |
|---|---|---|
| EP | 3 460 323 | 3/2019 |
| KR | 10-1684302 | 12/2016 |
| WO | 2020016679 A1 | 1/2020 |

OTHER PUBLICATIONS

Indian Examination Report under sections 12 & 13 of the Patents Act, 1970 and the Patents Rules, 2003, Indian Application No. 202224011274, dated Oct. 7, 2022, 5 pages.

French Search Report, Application No. FR 2102902, dated Jan. 18, 2022, 12 pages. English language translation included.

* cited by examiner

IEC ZONE 1 RATED LED LIGHT ENGINE USING PRE-MOLDED OPTIC

RELATED APPLICATIONS

This application claims priority to French Application No. 2102902 filed on Mar. 23, 2021 entitled "IEC ZONE 1 Rated LED Light Engine using Pre-Molded Optic" the contents of which are incorporated by reference herein in their entirety.

FIELD

The present disclosure relates to the field of luminaires. More particularly, the present disclosure relates to the field of LED engines used in luminaires.

Definitions

As used in the present disclosure, the following terms are generally intended to have the meaning as set forth below, except to the extent that the context in which they are used indicates otherwise.

The expression "LED engine" used hereinafter in this specification refers to, but is not limited to, an integrated assembly comprising LED arrays positioned on a printed circuit board, and an encapsulation layer, that may be connected to an LED driver. More specifically, an LED engine includes LED chips mounted on a printed circuit board that has electrical connections and mechanical fixings, and is ready to be fixed in a luminaire.

The expression "Zone—1" used hereinafter in this specification refers to, but is not limited to, an area in which an explosive atmosphere is likely to occur occasionally in normal operation. It may exist because of repair, maintenance operations, or leakage.

The expression "Zone—2" used hereinafter in this specification refers to, but is not limited to, an area in which an explosive atmosphere is not likely to occur in normal operation but, if it does occur, will persist for a short period only. These areas become hazardous only in an event of an accident or some unusual operating condition.

These definitions are in addition to those expressed in the art.

BACKGROUND

The background information herein below relates to the present disclosure but is not necessarily prior art.

LED luminaires are widely used in industrial environments. However, in industrial environments, where an explosive atmosphere persists between 10 and 1000 hours a year due to the nature of the products being manufactured or processed, the electrical discharges are required to be tightly controlled in order to prevent explosions. It is mandatory to ensure that the electrical products used in such explosive atmospheres should eliminate the potential for electrical discharges such as sparks or arcs.

Conventionally, the lighting fixtures, which are used in zone—1 applications, are flame proof fixtures. These flame proof fixtures are usually heavy and bulky which is not desired. Further, completely encapsulated LED engines were introduced, as an alternative to conventional flame proof structures and other known conventional techniques, for preventing electrical discharges considering the complexity and difficulty involved with other known conventional techniques. However, in order to fulfill the requirement of the desired lumen output, multiple LED arrays are needed in a single LED engine of an LED luminaire, thereby increasing the number of interconnections required and the quantity of wires joined to light up the LED arrays. The increased number of interconnections and wiring also shrinks the reliability of the conventional encapsulated LED engine. Further, various protection methods are known in the art to make the LED luminaire compatible for hazardous industrial environments. However, such methods lower the efficacy and adversely affect the beam pattern generated by LED arrays. Further, such conventional methods are costly.

Therefore, there is felt a need of an encapsulated LED engine that alleviates the abovementioned drawbacks and is compatible for hazardous industrial environments.

OBJECTS

Some of the objects of the present disclosure, which at least one embodiment herein satisfies, are as follows:

An object of the present disclosure is to provide an encapsulated LED engine and a process of making the encapsulated LED engine that are cost effective.

Still another object of the present disclosure is to provide an encapsulated LED engine which has reduced surface temperature.

Yet another object of the present disclosure is to provide an encapsulated LED engine which has a simple configuration.

Still another object of the present disclosure is to provide an encapsulated LED engine which has improved life.

Yet another object of the present disclosure is to provide an encapsulated LED engine that is not prone to early de-lamination due to frequent exposure to thermal shocks.

Still another object of the present disclosure is to provide an encapsulated LED engine that eliminates the requirement of secondary optics.

Yet another object of the present disclosure is to provide an encapsulated LED engine that is modular.

Yet another embodiment of the present disclosure is to provide an encapsulated LED engine that eliminates formation of air bubbles.

Yet another object of the present disclosure is to provide a process for encapsulating an LED engine that does not affect the beam pattern of the LED arrays.

Other objects and advantages of the present disclosure will be more apparent from the following description, which is not intended to limit the scope of the present disclosure.

SUMMARY

The present disclosure envisages an encapsulated LED engine. The LED engine comprises a printed circuit board, a plurality of LED arrays, and an encapsulation layer.

Each of the plurality of LED arrays is mounted on the printed circuit board, and is electrically connected to each other. Each of the LED arrays includes a plurality of LEDs electrically connected to each other.

The encapsulation layer is configured to encapsulate each of the LED arrays and the electrical connections therebetween. The encapsulation layer is a pre-molded optic that may be secured to the printed circuit board with an adhesive. The pre-molded optic is sandwiched between a frame and a printed circuit board. The frame is secured to the printed circuit board using fasteners. The frame includes a plurality of ribs to abut the pre-molded optic. Preferably the ribs are positioned in a "star" configuration with each rib directed towards a center of the LED array.

In one aspect, an LED engine is provided having a printed circuit board, a plurality of LED arrays, each of said LED arrays mounted on said printed circuit board, and electrically connected to each other, an encapsulation layer comprising a pre-molded optic positioned over and adhered to the printed circuit board, and a frame positioned over the LED arrays and secured to the printed circuit board.

In another aspect, a method of forming an LED engine is provided. The method includes the steps of (i) providing a printed circuit board having a plurality of LED arrays mounted on said printed circuit board, and electrically connected to each other, an encapsulation layer comprising a pre-molded optic, and a frame positionable over the pre-molded optic; (ii) adhering the pre-molded optic onto the LED arrays;

and (iii) securing the frame to the printed circuit board.

BRIEF DESCRIPTION OF THE ACCOMPANYING DRAWING

Figure 1B:
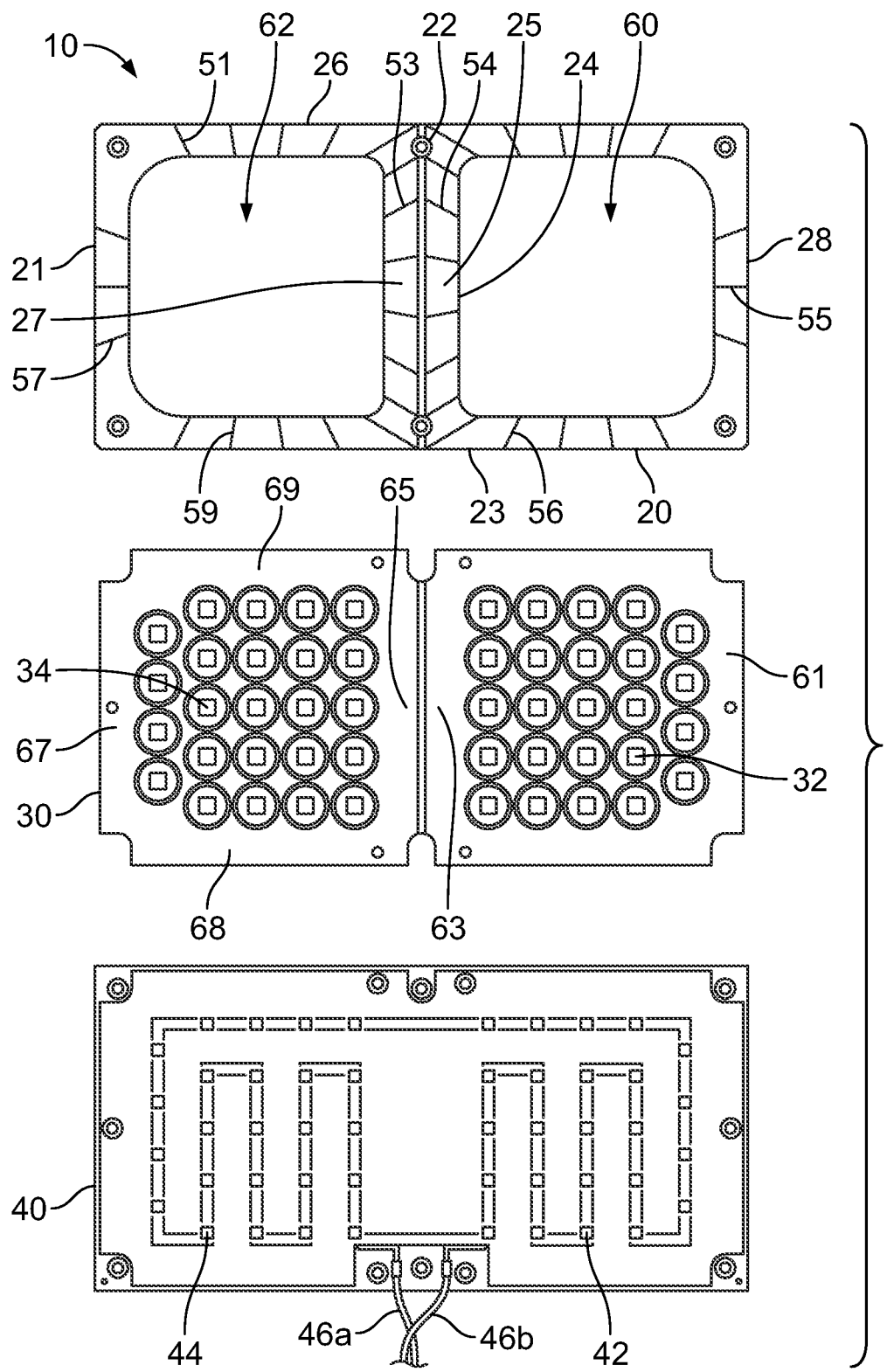
Figure 2:
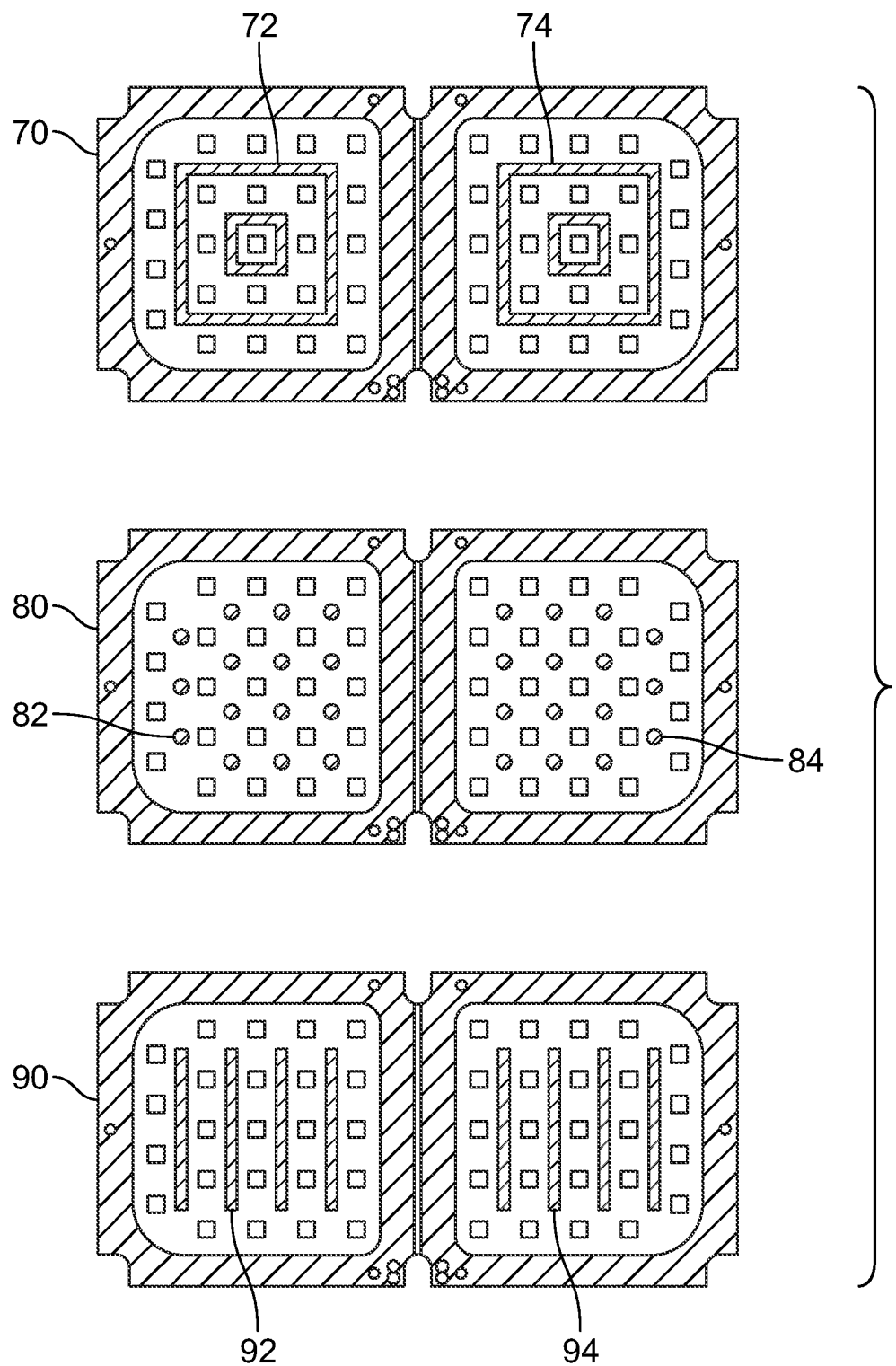
Figure 3:
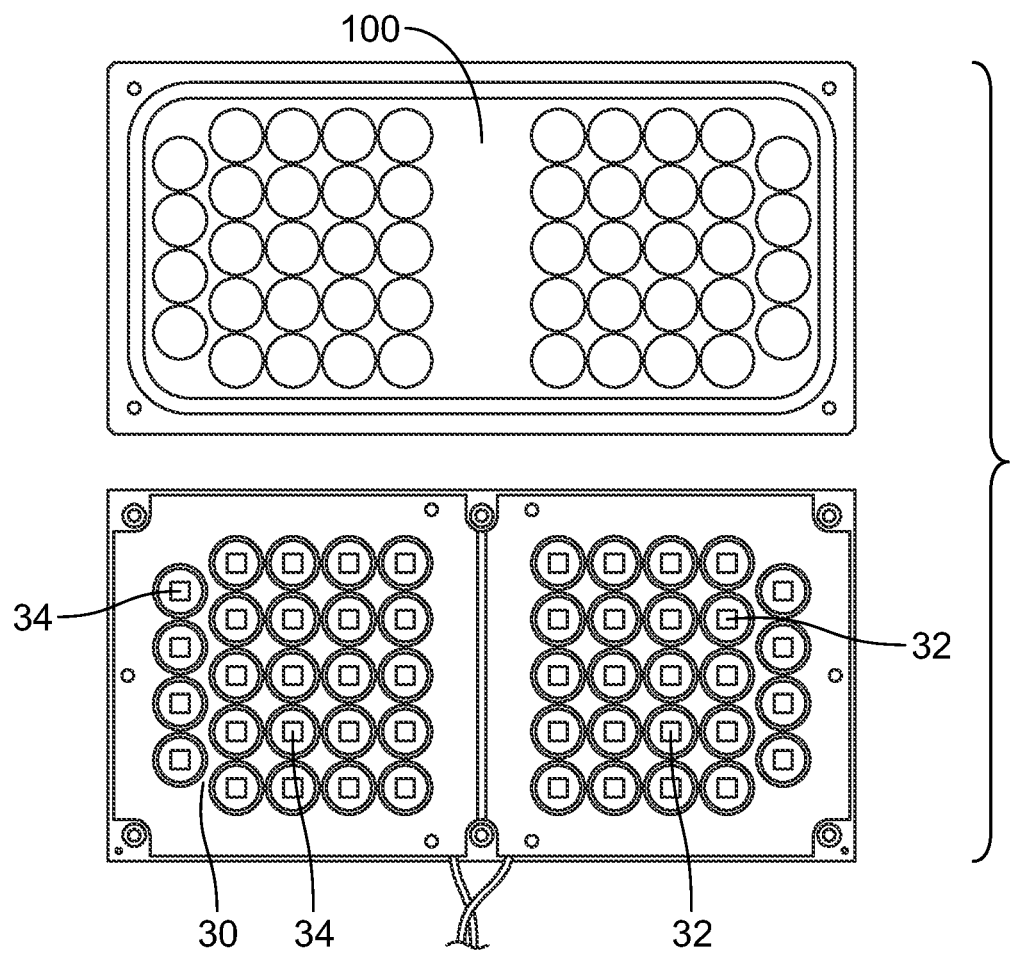
Figure 4:
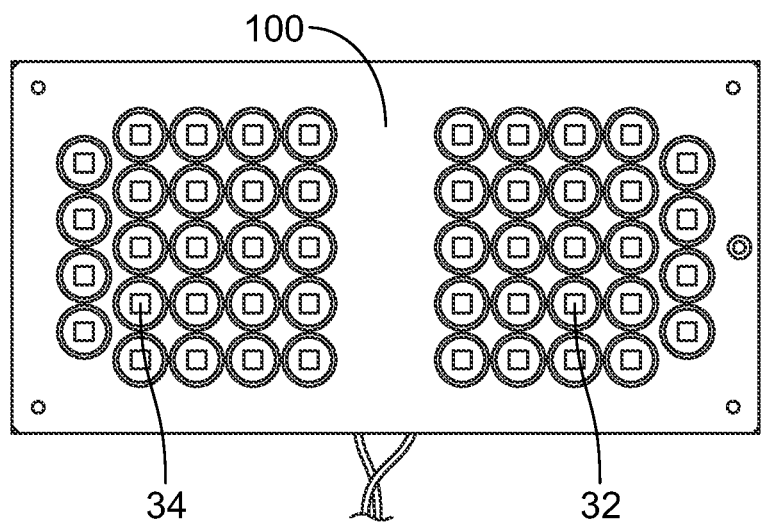
Figure 5:
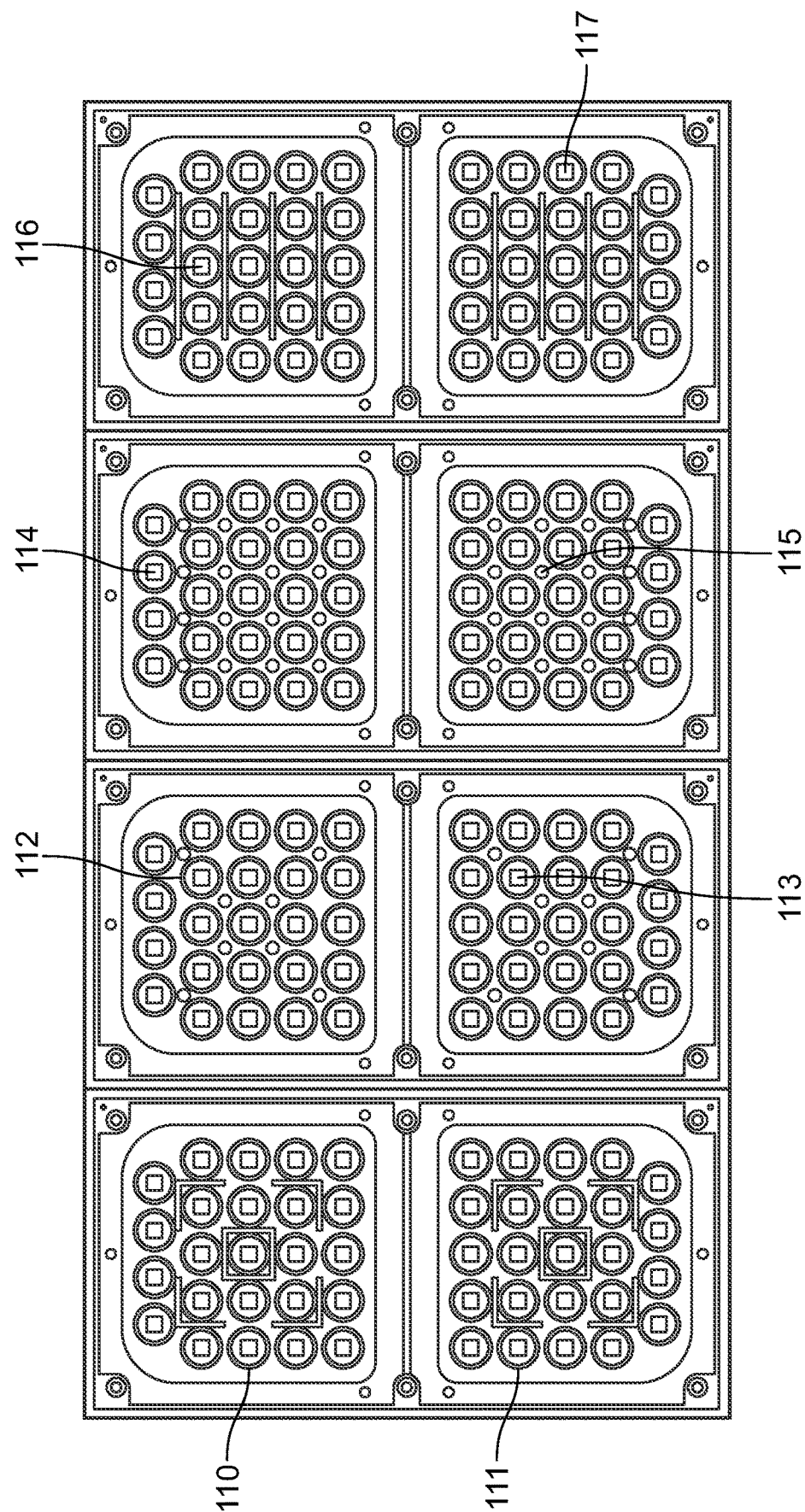

An encapsulated LED engine, of the present disclosure, will now be described with the help of the accompanying drawings, in which:

FIG. 1A illustrates an exploded view of LED engine 10 having LED arrays positioned on printed circuit board 40, a pre-molded optic 30, and a frame 20, in accordance with an embodiment of the present disclosure;

FIG. 1B shows a top view of LED arrays positioned on printed circuit board 40, pre-molded optic 30, and frame 20 of the LED engine 10 shown in FIG. 1A;

FIG. 2 illustrates a top view of various locations of adhesive that may be positioned on the pre-molded optic prior to adherence to the printed circuit board;

FIG. 3 illustrates a top view of jig 100 that may be used to compress the pre-molded optic 30 to adhere the pre-molded optic 30 to the printed circuit board;

FIG. 4 illustrates a top view of jig 100 positioned over pre-molded optic 30; and FIG. 5 illustrates a top view of different adhesive patterns used to secure the pre-molded optic to the printed circuit board.

LIST OF REFERENCE NUMERALS

10—LED engine
20—Frame
30—pre-molded optic
40—LED Array on Printed Circuit Board
42, 44—LED Arrays
46a, 46b—Electrical wires
51, 53, 54, 55, 56, 57—Ribs
61, 63, 65, 67, 68, 69—Surfaces of pre-molded optic 30 to which ribs are forced against
100—Jig

DETAILED DESCRIPTION

Embodiments, of the present disclosure, will now be described with reference to the accompanying drawings.

Embodiments are provided so as to thoroughly and fully convey the scope of the present disclosure to the person skilled in the art. Numerous details, are set forth, relating to specific components, and methods, to provide a complete understanding of embodiments of the present disclosure. It will be apparent to the person skilled in the art that the details provided in the embodiments should not be construed to limit the scope of the present disclosure. In some embodiments, well-known processes, well-known apparatus structures, and well-known techniques are not described in detail.

The terminology used, in the present disclosure, is only for the purpose of explaining a particular embodiment and such terminology shall not be considered to limit the scope of the present disclosure. As used in the present disclosure, the forms "a," "an," and "the" may be intended to include the plural forms as well, unless the context clearly suggests otherwise. The terms "comprises," "comprising," "including," and "having," are open ended transitional phrases and therefore specify the presence of stated features, integers, steps, operations, elements, modules, units and/or components, but do not forbid the presence or addition of one or more other features, integers, steps, operations, elements, components, and/or groups thereof. The particular order of steps disclosed in the method and process of the present disclosure is not to be construed as necessarily requiring their performance as described or illustrated. It is also to be understood that additional or alternative steps may be employed.

When an element is referred to as being "mounted on," "engaged to," "connected to," or "coupled to" another element, it may be directly on, engaged, connected or coupled to the other element. As used herein, the term "and/or" includes any and all combinations of one or more of the associated listed elements.

The terms first, second, third, etc., should not be construed to limit the scope of the present disclosure as the aforementioned terms may be only used to distinguish one element, component, region, layer or section from another component, region, layer or section. Terms such as first, second, third etc., when used herein do not imply a specific sequence or order unless clearly suggested by the present disclosure.

Terms such as "inner," "outer," "beneath," "below," "lower," "above," "upper," and the like, may be used in the present disclosure to describe relationships between different elements as depicted in the Figures.

The present disclosure envisages an encapsulated LED engine.

The LED engine 10, of the present disclosure, is now described with reference to FIG. 1A through FIG. 5.

Referring to FIG. 1A, an LED engine 10 comprises a printed circuit board 40, with a plurality of LED arrays 42, 44 mounted thereon, pre-molded optic 30, and a frame 20.

Each of the plurality of LED arrays 42, 44 are mounted on the printed circuit board 40, and is electrically connected to each other. As will be appreciated, the number of LEDs on the LED arrays 42, 44 may vary. In addition, a fewer or greater number of LED arrays may be used in the encapsulated LED engine. Wires 46a and 46b may be used for electrical connection to an LED driver.

The pre-molded optic 30 includes overlays 32 and 34 that are positioned over the individual LEDs on LED arrays 42, 44. The overlays 32, 34 include a plurality of bubbles that serve as lenses for the LEDs on the LED arrays 42, 44.

Frame 20 includes a first vertical end 21 and a second vertical end 28 with a vertical member 24 positioned between the first vertical end 21 and the second vertical end 28. Each of the first vertical end 21, second vertical end 28, and vertical member 24 are attached to top horizontal member 23 and bottom horizontal member 26.

A plurality of fasteners 22, which may be threaded screws, are used to secure frame 20 to printed circuit board 40, with pre-molded optic 30 sandwiched between frame 20 and printed circuit board 40.

The frame 20 includes two openings 60, 62 that allow the light from the LED arrays 42, 44 to pass through.

FIG. 1B shows a top view of LED arrays 42, 44 positioned on printed circuit board 40, pre-molded optic 30, and frame 20 of the LED engine 10 shown in FIG. 1A. Printed circuit board 40 includes LED arrays 42, 44, as well as wires 46a and 46b that may be electrically connected to an LED driver.

An underside view of frame 20 is shown. A plurality of ribs 51, 53, 54, 55, 56, 57, and 59 are positioned on the underside of frame 20. The plurality of ribs extend towards the center of openings 60, 62. The plurality of ribs are preferably positioned in a "star" shaped configuration.

When the frame 20 is secured to the printed circuit board 40, the plurality of ribs abut portions 61, 63, 65, 67, 68, and 69 of pre-molded optic 30. As shown in FIGS. 1A and 1B, the individual LEDs on LED arrays 42, 44 are electrically interconnected and also electrically connected to wires 46a and 46b.

FIG. 2 illustrates a top view of various locations of adhesive that may be positioned on the pre-molded optic 30 prior to adherence to the printed circuit board 40. In particular, pre-molded optic 70, shows the layout of cross-hatched adhesive portions 72 and 74. Pre-molded optic 80 shows square adhesive portions interspersed between LEDs 82, 84. Pre-molded optic 90 shows the layout of cross-hatched adhesive portions 92, 94.

FIG. 3 illustrates a top view of jig 100 that may be used to compress the pre-molded optic 30 to adhere the pre-molded optic 30 to the printed circuit board 40. Jig 100 includes circular cut-outs through which the bubbles or lenses on the pre-molded optic 30 may extend through. The jig 100 compresses the pre-molded optic 30 as the adhesive is cured between the pre-molded optic 30 and the printed circuit 40.

FIG. 4 illustrates a top view of jig 100 positioned over pre-molded optic 30.

FIG. 5 illustrates a top view of different adhesive patterns used to secure the pre-molded optic 30 to the printed circuit board 40. In FIG. 5, LED arrays 110, 111, 112, 113, 114, 115, 116, and 117 are shown.

In the foregoing Figures, the pre-molded optic 30 serves as encapsulation layer configured to encapsulate each of the LED arrays 42, 44 on the printed circuit board 40 to protect the area proximal to the printed circuit board from arc and spark, i.e., electrical discharges, generated by the LED arrays 42, 44 on printed circuit board 40.

In one embodiment, the pre-molded optic 30 serving as an encapsulation layer is made of silicone.

The encapsulated LED engine 10, of the present disclosure, can be used in Zone—1 and Zone—2 applications. Specifically, in order to use the encapsulated LED engine 10 in Zone—1 application, the required thickness of the pre-molded optic 30 forming the encapsulation layer may be greater than or equal to 3 mm. The encapsulated LED engine 10 can also be used in industrial LED luminaires. Further, pre-molded optic 30 serving as an encapsulation layer provides a desired light distribution pattern without requiring use of any further lenses or reflectors.

The LED light engine 10 includes a pre-molded silicone optic 30 (with or without lenses) that is adhesively attached to LED arrays 42, 44 soldered to a printed circuit board 40. A metallic frame 20, which can be made of aluminium, is used to prevent detachment of the adhesive (RTV) around the edges of the LED arrays 42, 44 and pre-molded optic 30 when the assembly is subjected to high temperature accelerated aging and related thermally induced expansion and contraction of the silicone lens on the pre-molded optic 30. The frame 20 is designed in such a way that it does not completely restrain the horizontal expansion/contraction of the pre-molded optic 30. The frame 20 has an interface surface with the pre-molded optic 30 advantageously includes small raised ribs. The ribs are arranged radially and in line with the optic's thermally induced linear expansion and contraction in order to allow the pre-molded optic 30 to move under the frame 20 and prevent buckling of the central area of the pre-molded optic 30 within the frame 20. The ribs also act to slightly press on the surface of the adhesively attached pre-molded optic 30 preventing the pre-molded optic 30 from detaching from the printed circuit board 40. Additionally, adhesive is distributed in the central area of the pre-molded optic 30 (within frame boundaries) to provide retention of the pre-molded optic 30 to the printed circuit board 40 and prevent the pre-molded optic 30 from sagging due to the force of gravity working on the pre-molded optic 30.

The pre-molded optic 30 may be made from MS1002 available from DOW.

The adhesive used to adhere the pre-molded optic 30 to the LED arrays 42, 44 and the printed circuit board 40 may be RTV sealant 5818 available from Momentive.

The use of a pre-molded silicone optic 30 adhesively attached to a printed circuit board 40 is in compliance with IEC 60069-18 (Equipment Protection by Encapsulation).

The combination of a pre-molded silicone optic 30, adhesive, and metal frame 20 with expansion/retention ribs maintains a gas tight seal between the pre-molded optic 30 and the LED arrays 42, 44 on the printed circuit board 40. The metal frame 20 could be made of stainless steel, aluminium, or other suitable metals, as well as plastic or other rigid materials. Alternative patterns of the adhesive could also be used, alternative adhesive could also be used.

In addition, the use of a pre-molded optic 30 avoids bubbles and dirt specs from being captured when using a poured on silicone encapsulant. Further, multiple varions of a pre-molded optic may be used interchangeably at final assembly of the LED arrays 42, 44 and pre-molded optic 30 may be used at the time of assembly to provide different optical patterns or other properties as needed for the LED light fixture. This interchangeability avoids excess inventories of LED light engines needed for cast-on encapsulation alternatives, and as such provide for a lower cost than employing directly cast-on silicone encapsulation.

TECHNICAL ADVANCEMENTS

The present disclosure described herein above has several technical advantages including, but not limited to, the realization of an encapsulated LED engine that:
    is cost effective;
    has reduced surface temperature;
    has a simple configuration;
    has improved life;
    is not prone to early de-lamination due to frequent exposure to thermal shocks;
    eliminates the requirement of secondary optics;
    is modular;
    better utilizes printed circuit board's space;
    eliminates formation of air bubbles;
    is light in weight; and
    does not affect beam pattern of the LED arrays.

The foregoing disclosure has been described with reference to the accompanying embodiments which do not limit the scope and ambit of the disclosure. The description provided is purely by way of example and illustration.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. An encapsulated LED engine comprising:
a printed circuit board;
a plurality of LED arrays, each of said LED arrays mounted on said printed circuit board, and electrically connected to each other;
a flexible encapsulation layer comprising a pre-molded optic positioned over and adhered to the printed circuit board using an adhesive; and
a frame, separate from the pre-molded optic, positioned over the LED arrays and secured to the printed circuit board;
wherein the underside of the frame includes a plurality of ribs that abut the pre-molded optic; and;
wherein the plurality of ribs extend toward the center of the LED arrays.

2. The encapsulated LED engine as claimed in claim 1, wherein the ribs are positioned in a star-like pattern.

3. The encapsulated LED engine as claimed in claim 1, wherein the flexible encapsulation layer comprises silicone.

4. An encapsulated LED engine comprising:
a printed circuit board;
a plurality of LED arrays, each of said LED arrays mounted on said printed circuit board, and electrically connected to each other;
an encapsulation layer comprising a pre-molded optic positioned over and adhered to the printed circuit board;
a frame positioned over the LED arrays and secured to the printed circuit board;
wherein the frame includes a vertical first end and a vertical second end and a vertical member extending between the vertical first end and the vertical second end; and
wherein a plurality of ribs are positioned on an underside of the vertical first end, vertical second end, and vertical member.

5. The encapsulated LED engine as claimed in claim 4, wherein the vertical first end, vertical second end, and vertical member are attached to both a horizontal top member and horizontal bottom member.

6. The encapsulated LED engine as claimed in claim 5, wherein a plurality of ribs are positioned on an underside of the horizontal top member and horizontal bottom member.

7. The encapsulated LED engine as claimed in claim 6, wherein the plurality of ribs abut the pre-molded optic.

8. The encapsulated LED engine as claimed in claim 7, wherein the plurality of ribs extend toward a center of the LED arrays.

9. The encapsulated LED engine as claimed in claim 8, wherein the ribs are positioned in a star-like pattern.

10. A method of forming an encapsulated LED engine including:
providing a printed circuit board having a plurality of LED arrays mounted on said printed circuit board, and electrically connected to each other, a flexible encapsulation layer comprising a pre-molded optic, and a frame, separate from the pre-molded optic, positionable over the pre-molded optic;
adhering the pre-molded optic onto the LED arrays;
securing the frame to the printed circuit board;
wherein an underside of the frame includes a plurality of ribs that abut the pre-molded optic; and;
wherein the plurality of ribs extend toward a center of the LED arrays.

11. The method of claim 10, wherein the flexible encapsulation layer comprises silicone.

12. The method of claim 10, wherein the frame includes a vertical first end, a vertical second end and a vertical member that extends between the vertical first end and the vertical second end that are each secured to a horizontal top member and a horizontal bottom member.

13. The method of claim 12, wherein the plurality of ribs are positioned on an underside of the vertical first end, vertical second end, vertical member, horizontal top member, and horizontal bottom member.

14. The method of claim 10, including positioning a jig over the pre-molded optic and pressing down on the jig as an adhesive used to adhere the pre-molded optic to the LED arrays is cured.

* * * * *